United States Patent
Endo et al.

(10) Patent No.: US 9,761,421 B2
(45) Date of Patent: Sep. 12, 2017

(54) INDIUM CYLINDRICAL SPUTTERING TARGET AND MANUFACTURING METHOD THEREOF

(71) Applicant: JX Nippon Mining & Metals Corporation, Chiyoda-ku, Tokyo (JP)

(72) Inventors: Yousuke Endo, Kitaibaraki (JP); Hideyuki Suzuki, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 80 days.

(21) Appl. No.: 14/375,811

(22) PCT Filed: Jan. 31, 2013

(86) PCT No.: PCT/JP2013/052263
§ 371 (c)(1),
(2) Date: Jul. 31, 2014

(87) PCT Pub. No.: WO2014/030362
PCT Pub. Date: Feb. 27, 2014

(65) Prior Publication Data
US 2015/0303039 A1    Oct. 22, 2015

(30) Foreign Application Priority Data

Aug. 22, 2012  (JP) ................. 2012-183427

(51) Int. Cl.
*C23C 14/00* (2006.01)
*H01J 37/34* (2006.01)
(Continued)

(52) U.S. Cl.
CPC ............ *H01J 37/3426* (2013.01); *B21B 1/46* (2013.01); *B21C 23/00* (2013.01); *B21J 5/002* (2013.01);
(Continued)

(58) Field of Classification Search
CPC ............................ H01J 37/3426; C23C 14/06
See application file for complete search history.

(56) References Cited

U.S. PATENT DOCUMENTS 3,046,651 A    7/1962  Olmon et al.
4,124,474 A    11/1978 Bomchil et al.
(Continued)

FOREIGN PATENT DOCUMENTS

CN    102644053 A    8/2012
DE    10063383 C1    3/2002
(Continued)

OTHER PUBLICATIONS

Office Action mailed Feb. 26, 2015 in co-pending U.S. Appl. No. 13/504,329.
(Continued)

*Primary Examiner* — Timon Wanga
(74) *Attorney, Agent, or Firm* — Nields, Lemack & Frame, LLC (57) ABSTRACT

Provided are an indium cylindrical sputtering target capable of providing good film thickness distribution and a method for production thereof. The indium cylindrical target comprises crystal grains whose average size is 1 mm to 20 mm over its surface to be sputtered. The method for manufacturing the indium cylindrical target includes the steps of: casting a semi-finished product of an indium cylindrical target integrated with a backing tube; and subjecting the semi-finished product to plastic working in its radial direction, wherein the plastic working is performed with a total thickness reduction rate of at least 10% over its longitudinal direction.

12 Claims, 2 Drawing Sheets

(51) Int. Cl.
*C22F 1/16* (2006.01)
*C23C 14/34* (2006.01)
*C23C 14/16* (2006.01)
*B21B 1/46* (2006.01)
*B21C 23/00* (2006.01)
*B21J 5/00* (2006.01)

(52) U.S. Cl.
CPC ............ *C22F 1/16* (2013.01); *C23C 14/16* (2013.01); *C23C 14/3414* (2013.01); *H01J 37/3423* (2013.01)

(56) References Cited

U.S. PATENT DOCUMENTS

| | | | |
|---|---|---|---|
| 5,054,195 | A | 10/1991 | Keck et al. |
| 5,269,453 | A | 12/1993 | Melton et al. |
| 5,630,918 | A | 5/1997 | Takahara et al. |
| 6,030,514 | A | 2/2000 | Dunlop et al. |
| 6,309,556 | B1 | 10/2001 | Joyce et al. |
| 6,719,034 | B2 | 4/2004 | Heck et al. |
| 9,023,487 | B2 | 5/2015 | Endo et al. |
| 9,139,900 | B2 | 9/2015 | Endo et al. |
| 9,490,108 | B2 | 11/2016 | Endo et al. |
| 2003/0089482 | A1 | 5/2003 | Heck et al. |
| 2004/0022664 | A1 | 2/2004 | Kubota et al. |
| 2005/0029675 | A1 | 2/2005 | Hua |
| 2005/0269385 | A1 | 12/2005 | Chen et al. |
| 2005/0279630 | A1 | 12/2005 | Fonte |
| 2008/0271779 | A1 | 11/2008 | Miller et al. |
| 2008/0289958 | A1 | 11/2008 | Kardokus et al. |
| 2009/0057141 | A1 | 3/2009 | Tauchi et al. |
| 2009/0065354 | A1 | 3/2009 | Kardokus et al. |
| 2009/0250337 | A1 | 10/2009 | Simons et al. |
| 2009/0277777 | A1 | 11/2009 | Schultheis et al. |
| 2010/0099214 | A1 | 4/2010 | Buquing |
| 2010/0165585 | A1 | 7/2010 | Lin et al. |
| 2011/0067997 | A1 | 3/2011 | Nguyen et al. |
| 2011/0089030 | A1 | 4/2011 | Juliano et al. |
| 2011/0155560 | A1 | 6/2011 | Kuramochi et al. |
| 2012/0213917 | A1* | 8/2012 | Simons ............ C23C 14/3414 427/74 |
| 2012/0273348 | A1 | 11/2012 | Endo et al. |
| 2013/0037408 | A1 | 2/2013 | Endo et al. |
| 2013/0105311 | A1 | 5/2013 | Maekawa et al. |
| 2013/0143069 | A1 | 6/2013 | Endo et al. |
| 2013/0153414 | A1* | 6/2013 | Endo ............... C23C 14/3414 204/298.13 |
| 2013/0264200 | A1 | 10/2013 | Schlott et al. |
| 2013/0270108 | A1 | 10/2013 | Endo et al. |
| 2014/0042018 | A1* | 2/2014 | Yamazaki ......... C23C 14/3407 204/192.25 |
| 2016/0126072 | A1 | 5/2016 | Endo |

FOREIGN PATENT DOCUMENTS

| | | |
|---|---|---|
| EP | 0500031 A1 | 8/1992 |
| EP | 2287356 A1 | 2/2011 |
| EP | 2612953 A1 | 7/2013 |
| JP | 57-185973 A | 11/1982 |
| JP | 58-145310 A | 8/1983 |
| JP | 63-111172 A | 5/1988 |
| JP | 63-44820 B | 9/1988 |
| JP | 3-99741 A | 4/1991 |
| JP | 4-301074 A | 10/1992 |
| JP | 5-214519 A | 8/1993 |
| JP | 6-287661 A | 10/1994 |
| JP | 8-60352 A | 3/1996 |
| JP | 8-218165 A | 8/1996 |
| JP | 8-281208 A | 10/1996 |
| JP | 9-25564 A | 1/1997 |
| JP | 10-280137 A | 10/1998 |
| JP | 11-236664 A | 8/1999 |
| JP | 2003-89869 A | 3/2003 |
| JP | 2003-136190 A | 5/2003 |
| JP | 2003-183820 A | 7/2003 |
| JP | 2003-533589 A | 11/2003 |
| JP | 2004-131747 A | 4/2004 |
| JP | 2005-2364 A | 1/2005 |
| JP | 2006-102807 A | 4/2006 |
| JP | 2006-322039 A | 11/2006 |
| JP | 2008-523251 A | 7/2008 |
| JP | 2009-242882 A | 10/2009 |
| JP | 2010-24474 A | 2/2010 |
| JP | 2011-236445 A | 11/2011 |
| JP | 4837785 B1 | 12/2011 |
| JP | 2012-052190 A | 3/2012 |
| JP | 2012-172265 A | 9/2012 |
| JP | 2012-251174 A | 12/2012 |
| TW | 1310409 B | 6/2009 |
| WO | 01/73156 A2 | 10/2001 |
| WO | 2012/029363 A1 | 3/2012 |
| WO | 2012/029364 A1 | 3/2012 |
| WO | 2012/108074 A1 | 8/2012 |
| WO | 2012/140928 A1 | 10/2012 |

OTHER PUBLICATIONS

Office Action mailed Dec. 31, 2014 in co-pending U.S. Appl. No. 13/704,086.
Notice of Allowance mailed Feb. 9, 2015 in co-pending U.S. Appl. No. 13/808,009.
Final Rejection mailed Jan. 28, 2015 in co-pending U.S. Appl. No. 13/809,296.
International Preliminary Report on Patentability mailed Mar. 5, 2015 in corresponding PCT application No. PCT/JP2013/052263.
Final Rejection mailed May 4, 2015 in co-pending U.S. Appl. No. 13/704,086.
Final Rejection mailed May 4, 2015 in co-pending U.S. Appl. No. 13/809,296.
Office Action—Restriction—mailed Apr. 23, 2015 in co-pending U.S. Appl. No. 13/819,499.
Notice of Allowance mailed Jun. 23, 2015 in co-pending U.S. Appl. No. 13/504,329.
Office Action mailed Jul. 13, 2015 in co-pending U.S. Appl. No. 13/819,499.
Office action mailed Aug. 27, 2015 in related U.S. Appl. No. 13/809,296.
European communication dated Dec. 23, 2015 in corresponding European patent application No. 13831560.1.
International Search Report mailed Jun. 24, 2014 in co-pending PCT application No. PCT/JP2014/058987.
International Preliminary Report on Patentability issued Jan. 14, 2016 in co-pending PCT application No. PCT/JP2014/058987.
Final rejection mailed Apr. 7, 2016 in co-pending U.S. Appl. No. 13/819,499.
Final rejection mailed Jun. 1, 2016 in co-pending U.S. Appl. No. 13/704,086.
Alloy Digest, Indium Semi-Conductor Grade (data sheet), ASM International, Mar. 1998, 2 pages.
Glossary of Metallurgical and Metalworking Terms, Metals Handbook, ASM Handbooks Online, ASM International, 2002, pp. 130-131, 4 pages.
A Dictionary of Chemistry, Sixth Edition, 2008, p. 283, p. 434, John Daintith, ed., 4 pages.
International Search Report mailed Aug. 9, 2011 in co-pending PCT application No. PCT/JP2011/065585.
Written Opinion of the International Searching Authority mailed Aug. 9, 2011 in co-pending PCT application No. PCT/JP2011/065585.
International Preliminary Report on Patentability transmitted Sep. 12, 2013 in co-pending PCT application No. PCT/JP2011/065585.
International Search Report mailed Aug. 9, 2011 in co-pending PCT application No. PCT/JP2011/065587.
International Preliminary Report on Patentability mailed Oct. 31, 2013 in co-pending PCT application No. PCT/JP2011/065587.
Taiwanese Communication, with English translation, dated Aug. 27, 2012 in co-pending Taiwanese patent application No. 100127178.

(56) References Cited

OTHER PUBLICATIONS

International Search Report mailed Jun. 28, 2011 in co-pending PCT application No. PCT/JP2011/061682.
International Preliminary Report on Patentability mailed Mar. 14, 2013 in co-pending PCT application No. PCT/JP2011/061682.
European communication mailed Jan. 2, 2014 in co-pending European patent application No. 11821381.8.
International Search Report mailed Aug. 28, 2012 in co-pending PCT application No. PCT/JP2012/068838.
International Preliminary Report on Patentability issued Mar. 25, 2014 in co-pending PCT application No. PCT/JP2012/068838.
International Search Report mailed Jun. 7, 2011 in co-pending PCT application No. PCT/JP2011/060969.
International Preliminary Report on Patentability mailed Feb. 28, 2013 in PCT application No. PCT/JP2011/060969.
International Search Report mailed Sep. 11, 2012 in co-pending PCT application No. PCT/JP2012/070766.
Written Opinion of the International Searching Authority transmitted Jun. 7, 2013 in co-pending PCT application No. PCT/JP2012/070766.
International Preliminary Report on Patentability mailed Jul. 17, 2014 in co-pending PCT application No. PCT/JP2012/070766.
International Search Report mailed May 7, 2013 in corresponding PCT application No. PCT/JP2013/052263.
Office Action mailed Oct. 18, 2013 in co-pending U.S. Appl. No. 13/504,329.
Final Rejection mailed Apr. 9, 2014 in co-pending U.S. Appl. No. 13/504,329.
Final Rejection mailed Sep. 26, 2014 in co-pending U.S. Appl. No. 13/504,329.
Office Action—Restriction—mailed Sep. 27, 2013 in co-pending U.S. Appl. No. 13/504,338.
Office Action mailed Dec. 18, 2013 in co-pending U.S. Appl. No. 13/504,338.
Final Rejection mailed Jun. 16, 2014 in co-pending U.S. Appl. No. 13/504,338.
Final Rejection mailed Sep. 22, 2014 in co-pending U.S. Appl. No. 13/504,338.
Office Action—Restriction—mailed May 23, 2013 in co-pending U.S. Appl. No. 13/808,009.
Office Action mailed Jul. 31, 2013 in co-pending U.S. Appl. No. 13/808,009.
Final Rejection mailed Feb. 12, 2014 in co-pending U.S. Appl. No. 13/808,009.
Office Action mailed Sep. 17, 2014 in co-pending U.S. Appl. No. 13/808,009.
Office Action mailed Sep. 26, 2014 in co-pending U.S. Appl. No. 13/809,296.
Office action mailed Dec. 15, 2015 in co-pending U.S. Appl. No. 13/704,086.
Office action mailed Nov. 18, 2015 in co-pending U.S. Appl. No. 13/819,499.
Office action mailed Aug. 24, 2016 in co-pending U.S. Appl. No. 13/819,499.
Notice of Allowance mailed Aug. 12, 2016 in co-pending U.S. Appl. No. 13/704,086.
Final rejection mailed Feb. 13, 2017 in co-pending U.S. Appl. No. 13/819,499.
Office action mailed Feb. 24, 2017 in co-pending U.S. Appl. No. 14/896,522.
Notice of allowance mailed Apr. 12, 2017 in co-pending U.S. Appl. No. 13/819,499.

* cited by examiner

INDIUM CYLINDRICAL SPUTTERING TARGET AND MANUFACTURING METHOD THEREOF

TECHNICAL FIELD

The invention relates to an indium cylindrical sputtering target and a manufacturing method thereof.

BACKGROUND ART

Indium is used as a sputtering target material for forming light-absorbing layers for Cu—In—Ga—Se (CIGS) of thin-firm solar cells.

Indium sputtering targets are generally manufactured by melt casting, and some documents about that are known. For example, JPS 63-44820 B2 (Patent Document 1) discloses a method for manufacturing a flat plate-shaped sputtering target, which includes forming an indium thin film on a backing plate and then pouring indium on the thin film to cast it, so that an indium sputtering target is formed integrally with the backing plate.

In recent years, however, use of cylindrical sputtering targets instead of flat plate-shaped sputtering targets has progressed because the efficiency of use of such target materials is relatively high. A cylindrical sputtering target, which is made of a target material fixed around a backing tube (BT) as a core, can be rotated during sputtering. Thus, the entire surface of this target material can be used as an erosion region and uniformly sputtered, so that the resulting efficiency of use of the target material can be high.

Melt casting is also a main stream method for manufacturing cylindrical sputtering targets. For example, US 2003/0089482 A (Patent Document 2) discloses the following process. An inner tube (target holder) is made of a first material with a melting point of 900 K or higher, and then a cylindrical mold is concentrically placed so as to surround the inner tube. A second material with a melting point of 800 K or lower is poured in a molten state into a space between the mold and the inner tube. After cooling and solidification, the mold is removed, so that an outer tube (target) made of the second material is obtained.

It is also known that a bonding layer is placed between a backing tube (BT) and a target material so that the adhesion between them can be increased. For example, JP 2008-523251 A (Patent Document 3) discloses a tube-shaped target including a supporting tube, at least one target tube placed on the outer surface of the supporting tube, and a bonding layer placed between the target tube and the supporting tube, wherein the bonding layer is electrically conductive and has a bonding ratio of more than 90%.

PRIOR ART DOCUMENT

Patent Literature 1: JPS 63-44820 B2
Patent Literature 2: US 2003/0089482 A
Patent Literature 3: JP 2008-523251 A

SUMMARY OF INVENTION

Problems to be Solved by Invention

As described above, cylindrical sputtering targets are promising technology, but sufficient studies have not been conducted on cylindrical type sputtering targets made of indium. For example, an indium cylindrical sputtering target can be manufactured using melt casting. In this case, it is difficult to keep the solidification rate constant during cooling, and particularly when a cylindrical target with a length of more than 1 m is formed, a nonuniform structure may be formed along the longitudinal direction (in other words, the direction of the height of the cylinder), which may cause the problem of the nonuniform thickness of a film-deposited substrate. In addition, coarse crystal grains may also be formed to interfere with film thickness uniformity. A problem in that film deposition rate is not sufficiently high also remains.

The present invention has been made in view of these circumstances, and an object of the invention is to provide an indium cylindrical sputtering target capable of providing good film thickness distribution and to provide a method for manufacturing such a target.

Means for Solving Problem

Having made intensive studies so as to solve the above-described problem, the present inventors have found that sputtering characteristics with good film thickness distribution can be obtained using an indium cylindrical sputtering target in which the crystal grain size of the target material is made fine and high uniformity is achieved along its longitudinal direction.

Conventional melt casting methods have a limitation in making crystal grain size fine, and can easily cause variations in cooling rate depending on site. Thus, such conventional methods cannot manufacture a fine and uniform structure. However, the present inventors have found that when an indium cylindrical sputtering target is subjected to plastic working under specific conditions, a fine and uniform structure can be obtained.

An aspect of the invention, which has been made based on the findings, is directed to an indium cylindrical target comprising crystal grains whose average size is 1 mm to 20 mm over its surface to be sputtered.

In an embodiment of the indium cylindrical target according to the invention, the indium cylindrical target comprises crystal grains with a straight-line grain boundary on its surface to be sputtered, wherein the straight-line grain boundary has a protrusion of grain boundary from a line segment defined by a straight line drawn between adjacent corners of a crystal grain and has an at least 50 μm long straight-line region, the protrusion being less than 0.1 mm in a direction of a normal to the line segment.

In another embodiment of the indium cylindrical target according to the invention, at least part of the straight-line grain boundary is a coincidence boundary.

In another embodiment of the indium cylindrical target according to the invention, the coincidence boundary has a Σ value of 7.

In another embodiment of the indium cylindrical target according to the invention, an area proportion of the crystal grains with a straight-line grain boundary is 5% or more.

In another embodiment of the indium cylindrical target according to the invention, the standard deviation of average crystal grain size is 6 mm or less over its surface to be sputtered.

In another embodiment of the indium cylindrical target according to the invention, the standard deviation of average crystal grain sizes at three places including a central portion, one end portion and another end portion in a longitudinal direction is 0.9 mm or less.

In another embodiment of the indium cylindrical target according to the invention, the standard deviation of average crystal grain sizes measured at positions separated by 90° along its circumference is 6 mm or less at each of its central portion, its one end portion and its another end portion in a longitudinal direction.

Another aspect of the invention is directed to a method for manufacturing an indium cylindrical target, which includes the steps of: casting a semi-finished product of an indium cylindrical target integrated with a backing tube; and subjecting the semi-finished product to plastic working in its radial direction, wherein the plastic working is performed with a total thickness reduction rate of 10% or more over a longitudinal direction of the semi-finished product.

In an embodiment of the method for manufacturing an indium cylindrical target according to the invention, the total thickness reduction rate is 50% or less.

In another embodiment of the method for manufacturing an indium cylindrical target according to the invention, the plastic working is performed in such a manner that the standard deviation of thickness reduction rates along the circumference direction of the semi-finished product of the indium cylindrical target is 5 or less.

In another embodiment of the method for manufacturing an indium cylindrical target according to the invention, the plastic working is performed using at least one method selected from the group consisting of rolling, extruding and pressing.

In another embodiment of the method for manufacturing an indium cylindrical target according to the invention, the plastic working is performed while a shaft is inserted in the backing tube.

Effect of Invention

The invention makes it possible to provide an indium cylindrical sputtering target capable of providing good in-plane film thickness distribution during sputtering.

MODE FOR CARRYING OUT INVENTION

1. Crystal Grain Size and Standard Deviation Thereof

The indium cylindrical sputtering target of the invention has a feature of crystal grains whose average size is 20 mm or less over the surface to be sputtered. This feature makes it possible to ensure high uniformity of the crystal structure of the whole of the target. The average crystal grain size is preferably 18 mm or less, more preferably 15 mm or less. An indium cylindrical sputtering target can be made by a method of fixing an indium target material onto the outer surface of a cylindrical backing tube (BT) by melt casting. In this method, the crystal grain size can be made smaller by increasing the cooling rate, but there is a limitation in making smaller crystal grains. In this method, it is also difficult to uniformly cool the whole product and coarse grains form at an insufficiently cooled place, so that as a whole, the product has a nonuniform structure. In the invention, however, plastic working is performed using the technique described below, so that an indium cylindrical sputtering target having finer crystal grains and higher uniformity is successfully manufactured.

As the crystal grain size decreases, the entire uniformity increases, and film thickness uniformity and sputtering stability also increase. However, when the grains are of at most a certain size, a further reduction in grain size can be less effective in increasing film thickness uniformity or sputtering stability. In addition, making an extremely fine crystal structure will take time and cost. Thus, the average crystal grain size is preferably 1 mm or more, more preferably 1.5 mm or more, over the surface to be sputtered.

In the indium cylindrical sputtering target of the invention, the average crystal grain size over the surface to be sputtered can be measured by the method described below. The surface of the target is slightly etched with an acid so that grain boundaries are made readily visible. Subsequently, an arbitrary 100 mm×100 mm area at a central portion in a longitudinal direction of the target surface, an arbitrary 100 mm×100 mm area at one end portion in the longitudinal direction (end portion A) of the target surface, and an arbitrary 100 mm×100 mm area at another end portion in the longitudinal direction (end portion B) of the target surface are each selected as a region to be measured. The number (N) of crystal grains in each region is visually counted. A crystal grain existing across the boundary between regions is counted as 0.5 in each region. A crystal grain existing at four corners is counted as 0.25 in each region.

The average crystal grain size over the surface can be determined through measuring the 12 regions in total described below. At each of the central portion, one end portion and another end portion in the longitudinal direction, the measurement of the region is performed at positions separated by 90° along the circumference (namely, the measurement of the region is performed at four positions per each site). The central portion in the longitudinal direction refers to a region lying in the range of 40 to 60% of the length when 0% of the length is defined as one longitudinal end and 100% of the length is defined as another longitudinal end. In the same way, one end portion (end portion A) refers to a region lying in the range of 0 to 20% of the length, and another end portion (end portion B) refers to a region lying in the range of 80 to 100% of the length.

The area (S=10,000 mm²) of the measured region is divided by the number (N) of the crystal grains, so that the average crystal grain area (s) in each region is calculated. Assuming that the crystal grains are spherical, the average crystal grain size (A) is calculated from the following equation.

$$A=2(s/\pi)^{1/2}$$

The average crystal grain size in each region is calculated in this manner. In the invention, the average crystal grain size over the surface to be sputtered is defined as the average of the average crystal grain sizes in the 12 regions.

The standard deviation over the surface to be sputtered is also defined as the standard deviation of the average crystal grain sizes in the 12 regions. In an embodiment of the indium cylindrical sputtering target according to the invention, the standard deviation over the surface may be 6 mm or less. The standard deviation over the surface is preferably 3 mm or less, more preferably 1 mm or less, and may be typically 0.1 to 5 mm.

Figure 2:
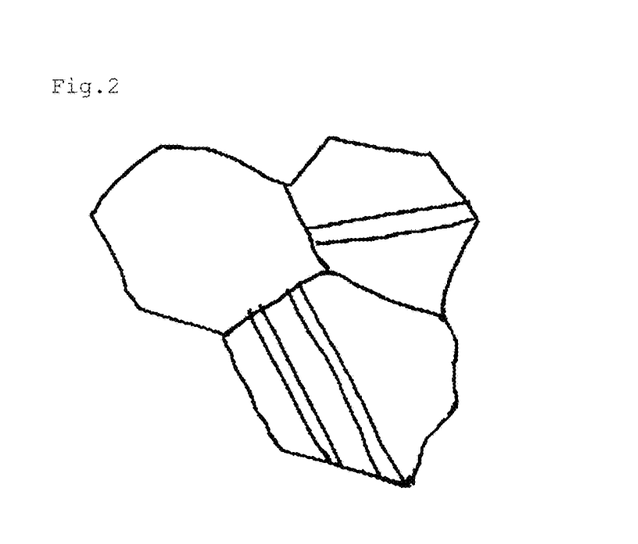
FIG. 2 is a schematic diagram of a crystal structure having straight-line grain boundaries in crystal grains.

FIG. 2 shows a schematic diagram of a crystal structure in a case where a straight-line grain boundary is formed in crystal grains. Since the target of the invention is manufactured using plastic working as described below, a straight-line grain boundary can be formed in normal crystal grains. In the invention, such a straight-line grain boundary is also counted when crystal grains are counted. In FIG. 2, nine crystal grains are counted.

In an embodiment of the indium cylindrical sputtering target according to the invention, the standard deviation of the average crystal grain sizes at the three places: the central portion, one end portion and another end portion in the longitudinal direction (called "standard deviation 4") may be 0.9 mm or less. This standard deviation is preferably 0.8 mm or less, more preferably 0.7 mm or less, and may be typically 0.1 to 0.8 mm. Such an indium cylindrical sputtering target is considered to have high crystal grain size uniformity along the longitudinal direction. In this case, the average crystal grain size at each of the central portion, one end portion and another end portion in the longitudinal direction is the average of the average crystal grain sizes measured at four positions separated by 90° along the circumference. The measurement of the region is performed at each of the four positions.

In an embodiment of the indium cylindrical sputtering target according to the invention, the standard deviation of the average crystal grain sizes measured at the four positions separated by 90° along the circumference at the central portion in the longitudinal direction (called "standard deviation 1"), the standard deviation of the average crystal grain sizes measured at the four positions separated by 90° along the circumference at one end portion in the longitudinal direction (called "standard deviation 2"), and the standard deviation of the average crystal grain sizes measured at the four positions separated by 90° along the circumference at another end portion in the longitudinal direction (called "standard deviation 3") may be each 6 mm or less, preferably 3 mm or less, more preferably 1 mm or less, typically 0.1 to 3 mm. The feature that the crystal grain size is uniform along the circumference can have the advantage of further improving the uniformity of a sputtered film.

In an embodiment of the invention, the indium cylindrical sputtering target has a length of 500 to 4,000 mm, typically 600 to 2,500 mm, more typically 600 to 2,000 mm in the longitudinal direction.

2. Straight-Line Grain Boundary

In an embodiment of the invention, the indium cylindrical sputtering target has crystal grains with a straight-line grain boundary on its surface to be sputtered. As used herein, the term "straight-line grain boundary" refers to a grain boundary having a protrusion of the grain boundary from a line segment defined by straight line drawn between adjacent corners of the crystal grain, the protrusion being less than 0.1 mm in a direction of a normal to the line segment. The line segment to be evaluated has a thickness of 0.01 mm. The term "straight-line" implies cases where there is a straight-line region of 50 μm or more, but does not imply cases where there is a straight-line region of less than 50 μm. When grains boundaries are made readily visible by etching, grain boundaries are etched in some cases depending on the degree of etching, but the straight-line shape is not degraded in such cases. In such cases, according to the invention, the grain boundary of the crystal grain to be observed is defined as the edge of the etched grain boundary.

As used herein, the term "crystal grains with a straight-line grain boundary" refers to crystal grains having grain boundaries at least one of which meets the definition of the straight-line grain boundary. In conventional commercialized indium cylindrical sputtering targets, grain boundaries are almost curved. In contrast, the indium sputtering target member of the invention has a number of straight-line grain boundaries.

Figure 1:
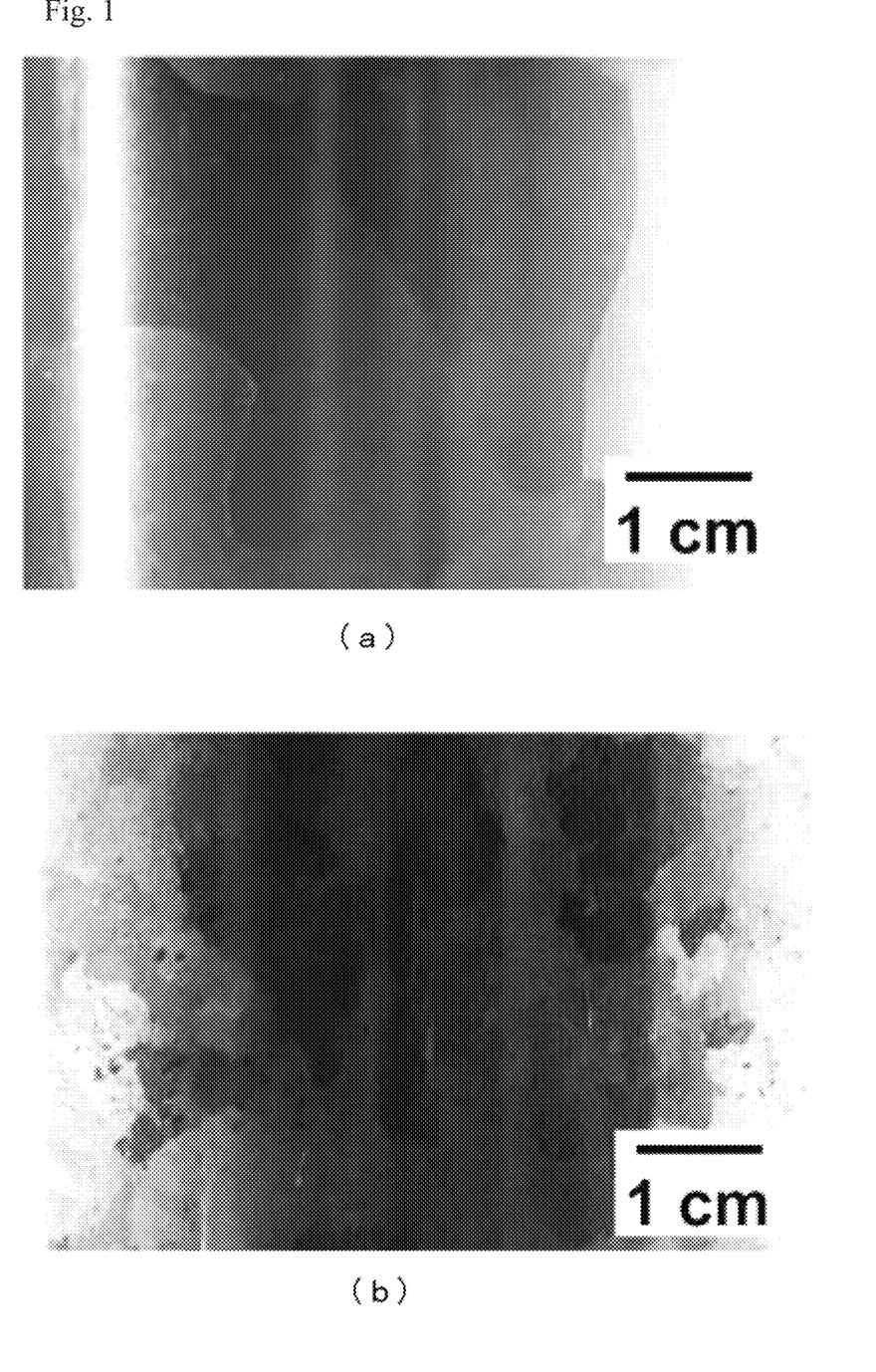
FIG. 1 is photographs showing an example of the crystal structure of a target (FIG. 1 (*a*)) obtained by a conventional casting method and an example of the crystal structure of a target (FIG. 1 (*b*)) according to the present invention, which are taken with a digital camera after the surface to be sputtered is made readily visible by etching.

The straight-line grain boundaries should be observed when the structure is sufficiently visible. For example, an altered layer formed by processing on the surface of the target should be removed by etching with an acid, electrolytic polishing, sputtering, or other techniques before the surface of the target is observed. The observation may be performed visually or using a digital camera, a digital microscope, an electron microscope, or other devices. FIG. 1 includes a typical photograph showing the surface of crystal grains of a conventional cylindrical sputtering target (FIG. 1 (a)) and a typical photograph showing the surface of crystal grains of a cylindrical sputtering target according to the invention having straight-line grain boundaries (FIG. 1 (b)), which are each obtained by taking a photograph of the surface of the target member with a digital camera after sputtering. The digital camera photographs after sputtering show that straight-line grain boundaries are observed in the product according to the invention, but not in the conventional target shown as a comparative example.

3. Area Proportion of Crystal Grains with Straight-Line Grain Boundary

In an embodiment of the indium cylindrical sputtering target according to the invention, the area proportion of crystal grains with a straight-line grain boundary is 5% or more. Increasing the area proportion of crystal grains with a straight-line grain boundary is effective in raising deposition rate. Although the reason for this is not clear, grain boundary energy and so on are considered to have an effect on deposition rate. If the area proportion is too low, the deposition rate-raising effect can be low. Thus, the area proportion is preferably 10% or more, more preferably 20% or more, even more preferably 25% or more, further more preferably 30% or more, further more preferably 40% or more, further more preferably 50% or more, further more preferably 60% or more, further more preferably 70% or more, and may be typically from 30% to 100%.

In the invention, the area proportion of crystal grains with a straight-line grain boundary can be measured using the method described below. The altered layer formed by processing on the surface of the indium target is removed by etching with an acid, electrolytic polishing, or sputtering, so that the structure is made readily observable. Subsequently, a picture is taken of the surface with a digital camera or the like. The picture is analyzed using image processing software and so on when the area of crystals with a straight-line structure and the area of the picture are determined. The area proportion of crystal grains with a straight-line grain boundary is expressed as {(the area of crystals with a straight-line structure)/(the area of the picture)}×100(%). In the measurement, the area of the picture is such that at least 10 crystal grains are included in the picture.

4. Coincidence Boundary

In an embodiment of the indium cylindrical sputtering target according to the invention, at least part of the straight-line grain boundary is a coincidence boundary. A coincidence boundary is a special grain boundary with high geometric consistency. Many materials with coincidence boundaries are superior in chemical or dynamic property than materials having only general grain boundaries (random grain boundaries). Specifically, a coincidence boundary is a grain boundary between adjacent crystals whose relationship is such that when one of them is rotated about a crystal axis, part of its lattice points periodically coincides with the lattice point of the other crystal grain (such lattice points are called coincidence lattice points). For this relationship, the ratio between the volume of the original unit cell and the volume of the unit cell newly formed by the coincidence lattice points is called Σ value. For example, coincidence boundaries are described in "Ceramic-Material Physics, Crystal and Boundary" (written and edited by Yuichi Ikuhara, published by THE NIKKAN KOGYO SHIMBUN, LTD., 2003, page 82).

In a typical embodiment of the indium cylindrical sputtering target according to the invention, the straight-line grain boundary is a Σ7 coincidence boundary. In the invention, a certain grain boundary located between indium crystals whose relationship is such that when they are rotated by approximately 85.5° (85.5°±1°) about the <110> axis as a common rotation axis, their orientations coincide with each other is defined to have a Σ value of 7. The Σ7 coincidence boundary can be identified by electron backscatter diffraction pattern (EBSP) method using a field emission electron probe micro analyzer (FEEPMA). Commercially-available FESEM/EBSP systems usually have no mode to identify the indium (tetragonal system) coincidence boundary. In a commercially-available FESEM/EBSP system, therefore, the common rotation axis and the rotation angle are set at <110> and 85.5° respectively so that the Σ7 coincidence boundary can be identified. The error of measurement of the rotation angle should be within the range of 85.5°±1° although it depends on the type of the system.

5. Manufacturing Method

Next, a preferred example of the method of the invention for manufacturing an indium cylindrical sputtering target will be described step by step. First, a melt of indium as a raw material is poured into a cylindrical mold (through which a backing tube concentrically passed along the longitudinal direction of the mold), and a semi-finished product of a cylindrical indium target is cast using the backing tube as part of the mold. During the casting, the mold is heated to 160° C. to 220° C. with a heater wound over the mold, and then allowed to cool in the air, so that the semi-finished product of the cylindrical target is obtained.

If the raw material indium used contains impurities, solar cells manufactured with the raw material may have low conversion efficiency. For this reason, the raw material indium to be used preferably has a high purity, for example, a purity of 99.99% by weight or more, typically a purity of 99.99% by weight to 99.9999% by weight. The backing tube may be made of any material known to those skilled in the art. Examples of such a material include stainless steel, titanium, and copper. Stainless steel and titanium are preferred because these materials have low solid solubility in indium.

Subsequently, the semi-finished product of the cylindrical target obtained by the casting is subjected to plastic working in the radial direction. Basically, the cast target contains a large number of coarse particles and is nonuniform. However, when the cast target is subjected to plastic working, it undergoes recrystallization (indium sufficiently undergoes recrystallization at normal temperature) to form a fine crystal structure. The plastic working may be any of rolling, extruding, pressing, and other working processes in the radial direction. The plastic working may be cold working or hot working. If the total thickness reduction rate is too low in the plastic working, the crystal structure cannot be made sufficiently fine. Thus, the plastic working is preferably performed in such a manner that the total thickness reduction rate is 10% or more, more preferably 13% or more. On the other hand, if the total thickness reduction rate is too high, the cast product should be thicker to form a final product with a certain thickness, and the effect of making the structure fine can also decrease. Thus, the plastic working is preferably performed in such a manner that the total thickness reduction rate is 35% or less, more preferably 33% or less.

Herein, the thickness reduction rate ($r$ (%)) is defined by the following formula: $r=(h2-h1)/h2 \times 100$, wherein $h2$ is the radial thickness of the target before the plastic working, and $h1$ is the radial thickness of the target after the plastic working. The total thickness reduction rate is defined as the average of the thickness reduction rates measured at four positions at one end portion, which are separated by 90° along the circumference.

The plastic working should also be performed to improve the uniformity of crystal grain size along the circumference direction. For this purpose, the plastic working is preferably performed in such a manner that the standard deviation of the thickness reduction rates along the circumference direction of the semi-finished product of the indium cylindrical target is 5 or less, more preferably 3 or less, even more preferably 1 or less. The standard deviation of the thickness reduction rates along the circumference direction is calculated using the following method. The thickness of the target is measured at the four positions after the casting and after the plastic working. The thickness reduction rate at each position is calculated, and the standard deviation of the thickness reduction rates at the four positions is calculated.

Hereinafter, an example where pressing is used will be described.

After the casting is finished, the semi-finished product of the cylindrical target is fixed in place, and a method of pressing the semi-finished product of the cylindrical target perpendicularly to the face of a mount may be performed.

In this process, the pressing is preferably performed in such a manner that the thickness reduction rate along the longitudinal direction is the same as that along the circumference direction so that crystal grains can be uniform along the longitudinal direction and the circumference direction of the target, respectively, and in such a manner that there is no gap between one pressing and another pressing.

In addition, a shaft having an outer diameter nearly equal to the inner diameter of the backing tube is preferably inserted in the backing tube so that the cylindrical shape of the target can be prevented from being distorted during the pressing. The shaft may be made of any material having such hardness that it is not deformed by the force applied during the pressing. Examples of such a material include stainless steel and cast irons. Stainless steel is preferred for the purpose of preventing contamination with rust and the like.

Figure 3:
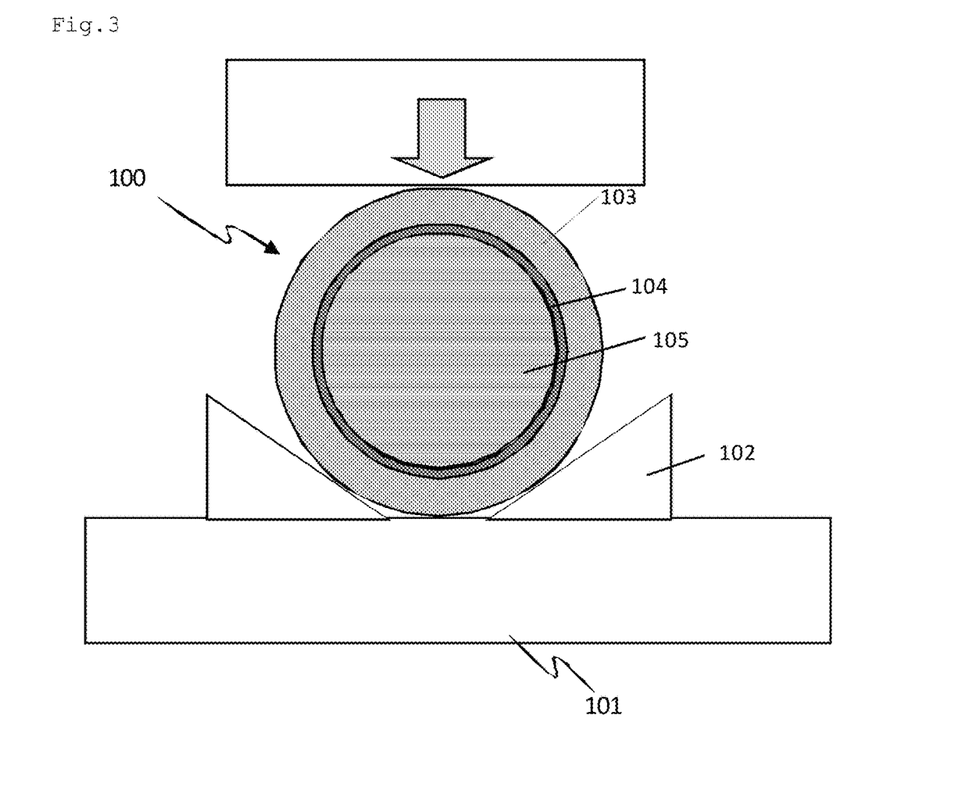
FIG. 3 is a schematic diagram showing an example of a plastic working method.

In FIG. 3, for example, the method used includes fixing the semi-finished product (100) of the cylindrical target with a mount (101), on which the semi-finished product (100) of the cylindrical target is placed, and with two supports (102) provided upstream and downstream with respect to the rotational direction so that when rotated, the semi-finished product (100) of the target is prevented from moving along the mount (101). In FIG. 3, the semi-finished product (100) of the cylindrical target is in contact with the flat surface of each support (102). However, this is non-limiting, and, for example, the contact surface may be circularly curved to fit the surface shape of the semi-finished product (100) of the cylindrical target.

Alternatively, rolling may be performed. A rolling process may include radially sandwiching the semi-finished product of the cylindrical indium target between a plurality of rollers and applying a pressure to the semi-finished product while the rollers are rotated around their central rotation axes so that the semi-finished product is rolled until a predetermined thickness reduction rate is reached. This process makes it possible to keep crystal grains uniform along the circumference direction. Alternatively, the semi-finished product of the indium target may be rolled along its longitudinal direction without being rotated. In this case, the target may be rotated a little every rolling process as in the case of the pressing. When extruding is performed, the indium target may be allowed to pass through a tube having a desired diameter. In this case, the tube may be tapered. It is also preferable to appropriately control the extrusion rate.

The radial thickness of the indium product having undergone the plastic working is generally about 5 to about 20 mm, typically about 8 to about 15 mm, although it is not restricted and may be appropriately determined depending on the sputtering device to be used, the time required for deposition, or other factors.

The indium cylindrical sputtering target obtained as described above is suitable for use in the production of light-absorbing layers for CIGS thin-film solar cells.

EXAMPLES

Hereinafter, examples of the invention will be shown together with comparative examples. These examples, which are provided for better understanding of the invention and advantageous effects thereof, are not intended to limit the invention.

In each of the examples and the comparative examples described below, an indium target with a length of 600 mm, an inner diameter of 133 mm, and an outer diameter of 151 mm was produced using a SUS304 backing tube with a length of 640 mm, an inner diameter of 125 mm, and an outer diameter of 133 mm.

Example 1

A melt of indium as a raw material was poured into a cylindrical mold (through which the backing tube concentrically passed along the longitudinal direction of the mold), and a semi-finished product of an indium target was cast using the backing tube as part of the mold. The mold was made of SUS304. Indium with a purity of 4 N was used as the raw material. During the casting, the mold was heated to 180° C. with a heater wound over the mold, and then allowed to cool in the air. After the casting, the semi-finished product of the indium target had a radial thickness of 14 mm (the outer diameter of the target was 161 mm).

The cast target was subjected to cold pressing as shown in FIG. 3. Two faces, upper and lower faces, were subjected to the pressing at a time. Every time the target was rotated by 5°, the pressing was performed. When the target was rotated by 180° in total, the whole of the target was plastically worked. To prevent the backing tube from being deformed, a SUS304 shaft was inserted in the backing tube. The average amount of thickness reduction was 1.5 mm on one side (the total of the average amounts of thickness reduction on the upper and lower sides was 3.0 mm), and the total thickness reduction rate was 10.6%. In this case, the total thickness reduction rate was defined as the average of thickness reduction rates measured at four positions at one end portion (end portion A), which were separated by 90° along the circumference. Table 1 shows the standard deviation of the thickness reduction rate along the circumference. The resulting target was worked into the size mentioned above by a cutting operation using a lathe, so that a cylindrical indium target was obtained. The term "cold pressing" refers to pressing under normal temperature conditions.

Example 2

A cylindrical indium target was produced as in Example 1, except that the pressing was performed in such a manner that the average amount of thickness reduction was 2 mm on one side and the total thickness reduction rate was 14.3%.

Example 3

A cylindrical indium target was produced as in Example 1, except that the pressing was performed in such a manner that the average amount of thickness reduction was 2.6 mm on one side and the total thickness reduction rate was 18.4%.

Example 4

A cylindrical indium target was produced as in Example 1, except that the pressing was performed in such a manner that the average amount of thickness reduction was 3.0 mm on one side and the total thickness reduction rate was 21.5%.

Example 5

A cylindrical indium target was produced as in Example 1, except that the pressing was performed in such a manner that the average amount of thickness reduction was 3.9 mm on one side and the total thickness reduction rate was 27.6%.

Example 6

A cylindrical indium target was produced as in Example 1, except that the pressing was performed in such a manner that the average amount of thickness reduction was 4.4 mm on one side and the total thickness reduction rate was 31.7%.

Example 7

A cylindrical indium target was produced as in Example 1, except that the pressing was performed in such a manner that the average amount of thickness reduction was 7 mm on one side and the total thickness reduction rate was 50.0%.

Example 8

In Example 8, a cylindrical indium target was produced using the same process as in Example 1, except that the pressing was performed under 100° C. conditions in such a manner that the average amount of thickness reduction was 2.5 mm on one side and the total thickness reduction rate was 17.8%, while care was taken not to change the total thickness reduction rate in the circumference direction.

Example 9

In Example 9, a cylindrical indium target was produced using the same process as in Example 1, except that the rolling was performed under 100° C. conditions in such a manner that the average amount of thickness reduction was 2.6 mm on one side and the total thickness reduction rate was 18.2%, while care was taken not to change the total thickness reduction rate in the circumference direction.

Example 10

In Example 10, a cylindrical indium target was produced using the same process as in Example 1, except that the rolling was performed under 25° C. conditions in such a manner that the average amount of thickness reduction was 2.6 mm on one side and the total thickness reduction rate was 18.3%, while care was taken not to change the total thickness reduction rate in the circumference direction.

Example 11

In Example 11, a cylindrical indium target was produced using the same process as in Example 1, except that the extruding was performed under 25° C. conditions in such a manner that the average amount of thickness reduction was 2.5 mm on one side and the total thickness reduction rate was 17.8%, while care was taken not to change the total thickness reduction rate in the circumference direction.

Comparative Example 1

A cast target was produced as in Example 1 and then worked into the size mentioned above by a cutting operation using a lathe, while the plastic working was not performed, so that a cylindrical indium target was obtained.

Comparative Example 2

A cylindrical indium target was produced as in Example 1, except that the pressing was performed in such a manner that the average amount of thickness reduction was 0.3 mm on one side and the total thickness reduction rate was 2.2%.

Comparative Example 3

A cylindrical indium target was produced as in Example 1, except that the pressing was performed in such a manner that the average amount of thickness reduction was 0.5 mm on one side and the total thickness reduction rate was 3.7%.

Comparative Example 4

A cylindrical indium target was produced as in Example 1, except that the pressing was performed in such a manner that the average amount of thickness reduction was 1.1 mm on one side and the total thickness reduction rate was 7.7%.

(Average Crystal Grain Size)

According to the measurement method described above, the average crystal grain size and the standard deviation thereof were determined from the values at the 12 regions mentioned above with respect to each of the indium targets obtained in the examples and the comparative examples. At each of the central portion, the end portion A and the end portion B in the longitudinal direction, the average crystal grain size was measured at positions separated by 90° along the circumference, and the standard deviations of the respective average crystal grain sizes were also calculated (called "standard deviation 1", "standard deviation 2", and "standard deviation 3," respectively). In addition, the standard deviation of the average crystal grain sizes at the central portion, the end portion A, and the end portion B in the longitudinal direction was also calculated (called "standard deviation 4"). The results are shown in Table 2.

TABLE 1

| | Working method | Average amount of thickness reduction [mm] | Total thickness reduction rate [%] | 0° position | | 90° position | |
|---|---|---|---|---|---|---|---|
| | | | | Amount of thickness reduction [mm] | Thickness reduction rate [%] | Amount of thickness reduction [mm] | Thickness reduction rate [%] |
| Example | | | | | | | |
| 1 | Cold pressing | 1.5 | 10.6 | 1.30 | 9.29 | 1.62 | 11.57 |
| 2 | Cold pressing | 2.0 | 14.3 | 2.01 | 14.36 | 2.14 | 15.29 |
| 3 | Cold pressing | 2.6 | 18.4 | 2.52 | 18.00 | 2.59 | 18.50 |
| 4 | Cold pressing | 3.0 | 21.5 | 3.10 | 22.14 | 3.09 | 22.07 |
| 5 | Cold pressing | 3.9 | 27.6 | 4.11 | 29.36 | 3.75 | 26.79 |
| 6 | Cold pressing | 4.4 | 31.7 | 4.62 | 33.00 | 4.20 | 30.00 |
| 7 | Cold pressing | 7.0 | 50.0 | 6.50 | 46.43 | 6.80 | 48.57 |
| 8 | Warm pressing | 2.5 | 17.8 | 2.51 | 17.93 | 2.53 | 18.07 |
| 9 | Warm rolling | 2.6 | 18.2 | 2.59 | 18.50 | 2.49 | 17.79 |
| 10 | Cold rolling | 2.6 | 18.3 | 2.48 | 17.71 | 2.58 | 18.43 |
| 11 | Extruding | 2.5 | 17.8 | 2.47 | 17.64 | 2.39 | 17.07 |
| Comparative Example | | | | | | | |
| 1 | Cold pressing | 0.0 | 0.0 | 0.00 | 0.00 | 0.00 | 0.00 |
| 2 | Cold pressing | 0.3 | 2.2 | 0.36 | 2.57 | 0.36 | 2.57 |
| 3 | Cold pressing | 0.5 | 3.7 | 0.45 | 3.21 | 0.68 | 4.86 |
| 4 | Cold pressing | 1.1 | 7.7 | 0.85 | 6.07 | 1.12 | 8.00 |

TABLE 1-continued

|  | 180° position | | 270° position | | Standard deviation of thickness reduction rate |
|---|---|---|---|---|---|
|  | Amount of thickness reduction [mm] | Thickness reduction rate [%] | Amount of thickness reduction [mm] | Thickness reduction rate [%] |  |
| Example |  |  |  |  |  |
| 1 | 1.52 | 10.86 | 1.49 | 10.64 | 0.96 |
| 2 | 1.85 | 13.21 | 2.02 | 14.43 | 0.85 |
| 3 | 2.69 | 19.21 | 2.48 | 17.71 | 0.66 |
| 4 | 2.75 | 19.64 | 3.12 | 22.29 | 1.27 |
| 5 | 3.50 | 25.00 | 4.11 | 29.36 | 2.13 |
| 6 | 4.42 | 31.57 | 4.52 | 32.29 | 1.28 |
| 7 | 7.19 | 51.36 | 7.50 | 53.57 | 3.13 |
| 8 | 2.44 | 17.43 | 2.51 | 17.93 | 0.28 |
| 9 | 2.51 | 17.93 | 2.62 | 18.71 | 0.45 |
| 10 | 2.61 | 18.64 | 2.60 | 18.57 | 0.43 |
| 11 | 2.57 | 18.36 | 2.55 | 18.21 | 0.59 |
| Comparative Example |  |  |  |  |  |
| 1 | 0.00 | 0.00 | 0.00 | 0.00 | 0.00 |
| 2 | 0.17 | 1.21 | 0.35 | 2.50 | 0.67 |
| 3 | 0.41 | 2.93 | 0.53 | 3.79 | 0.85 |
| 4 | 1.13 | 8.07 | 1.20 | 8.57 | 1.10 |

TABLE 2-1

|  | Working method | Average amount of thickness reduction (mm) | Total thickness reduction rate [%] | Grain size at central portion in longitudinal direction | | | | | |
|---|---|---|---|---|---|---|---|---|---|
|  |  |  |  | 0° position (mm) | 90° position (mm) | 180° position (mm) | 270° position (mm) | Standard deviation 1 (mm) | Average 1 (mm) |
| Example |  |  |  |  |  |  |  |  |  |
| 1 | Cold pressing | 1.5 | 10.6 | 9.9 | 17.5 | 15.4 | 17.4 | 3.6 | 15.1 |
| 2 | Cold pressing | 2.0 | 14.3 | 11.3 | 12.1 | 11.5 | 8.9 | 1.4 | 11.0 |
| 3 | Cold pressing | 2.6 | 18.4 | 9.9 | 10.2 | 10.9 | 11.8 | 0.8 | 10.7 |
| 4 | Cold pressing | 3.0 | 21.5 | 5.5 | 7.6 | 6.9 | 8.9 | 1.4 | 7.2 |
| 5 | Cold pressing | 3.9 | 27.6 | 1.5 | 3.5 | 3.8 | 2.9 | 1.0 | 2.9 |
| 6 | Cold pressing | 4.4 | 31.7 | 2.2 | 3.5 | 3.3 | 2.9 | 0.6 | 3.0 |
| 7 | Cold pressing | 7.0 | 50.0 | 1.6 | 1.3 | 1.3 | 1.1 | 0.2 | 1.3 |
| 8 | Warm pressing | 2.5 | 17.8 | 9.7 | 9.7 | 10.8 | 11.5 | 0.9 | 10.4 |
| 9 | Warm rolling | 2.6 | 18.2 | 13.0 | 12.4 | 11.5 | 10.7 | 1.0 | 11.9 |
| 10 | Cold rolling | 2.6 | 18.3 | 10.6 | 12.8 | 9.8 | 10.5 | 1.3 | 10.9 |
| 11 | Extruding | 2.5 | 17.8 | 11.0 | 10.2 | 10.5 | 13.4 | 1.5 | 11.3 |
| Comparative Example |  |  |  |  |  |  |  |  |  |
| 1 | Cold pressing | 0.0 | 0.0 | 52.1 | 25.0 | 35.0 | 37.0 | 11.2 | 37.3 |
| 2 | Cold pressing | 0.3 | 2.2 | 21.0 | 26.0 | 35.0 | 33.5 | 6.6 | 28.9 |
| 3 | Cold pressing | 0.5 | 3.7 | 18.1 | 23.5 | 19.2 | 35.0 | 7.7 | 24.0 |
| 4 | Cold pressing | 1.1 | 7.7 | 17.1 | 28.9 | 22.5 | 13.2 | 6.8 | 20.4 |

|  | Grain size at end portion A | | | | | |
|---|---|---|---|---|---|---|
|  | 0° position (mm) | 90° position (mm) | 180° position (mm) | 270° position (mm) | Standard deviation 2 (mm) | Average 2 (mm) |
| Example |  |  |  |  |  |  |
| 1 | 15.9 | 13.5 | 16.5 | 8.9 | 3.5 | 13.7 |
| 2 | 13.5 | 10.1 | 12.1 | 8.6 | 2.2 | 11.1 |
| 3 | 10.2 | 10.1 | 9.9 | 12.1 | 1.0 | 10.6 |
| 4 | 6.3 | 7.4 | 6.8 | 6.5 | 0.5 | 6.8 |
| 5 | 3.5 | 2.8 | 2.9 | 3.2 | 0.3 | 3.1 |

TABLE 2-1-continued

| | | | | | | |
|---|---|---|---|---|---|---|
| 6 | 1.3 | 2.7 | 3.2 | 2.9 | 0.8 | 2.5 |
| 7 | 1.2 | 1.5 | 1.6 | 1.7 | 0.2 | 1.5 |
| 8 | 11.0 | 10.0 | 11.1 | 10.9 | 0.5 | 10.8 |
| 9 | 12.1 | 11.5 | 10.7 | 11.1 | 0.6 | 11.4 |
| 10 | 10.5 | 11.2 | 12.1 | 10.9 | 0.7 | 11.2 |
| 11 | 10.5 | 11.9 | 12.9 | 12.1 | 1.0 | 11.9 |
| Comparative Example | | | | | | |
| 1 | 34.0 | 22.1 | 45.9 | 33.5 | 9.7 | 33.9 |
| 2 | 34.8 | 22.9 | 25.1 | 33.1 | 6.4 | 30.3 |
| 3 | 21.2 | 19.8 | 33.3 | 20.5 | 6.4 | 23.7 |
| 4 | 27.8 | 20.0 | 23.6 | 13.5 | 6.1 | 21.2 |

TABLE 2-2

| | Grain size at end portion B | | | | | | Grain size over the surface | | 3 regions |
|---|---|---|---|---|---|---|---|---|---|
| | 0° position [mm] | 90° position [mm] | 180° position [mm] | 270° position [mm] | Standard deviation 3 [mm] | Average 3 [mm] | Standard deviation [mm] | Average [mm] | Standard deviation 4 [mm] |
| Example | | | | | | | | | |
| 1 | 17.7 | 12.9 | 9.7 | 14.1 | 3.3 | 13.6 | 3.2 | 14.1 | 0.8 |
| 2 | 9.8 | 12.1 | 11.9 | 12.2 | 1.1 | 11.5 | 1.5 | 11.2 | 0.3 |
| 3 | 11.5 | 11.3 | 10.7 | 11.0 | 0.4 | 11.1 | 0.8 | 10.8 | 0.3 |
| 4 | 4.2 | 7.0 | 8.1 | 5.5 | 1.7 | 6.2 | 1.3 | 6.7 | 0.5 |
| 5 | 2.2 | 3.4 | 4.1 | 2.9 | 0.8 | 3.2 | 0.7 | 3.1 | 0.1 |
| 6 | 3.5 | 3.1 | 2.7 | 2.7 | 0.4 | 3.0 | 0.6 | 2.8 | 0.3 |
| 7 | 1.1 | 0.9 | 0.5 | 0.7 | 0.3 | 0.8 | 0.4 | 1.2 | 0.4 |
| 8 | 10.1 | 10.2 | 9.9 | 10.3 | 0.2 | 10.1 | 0.6 | 10.4 | 0.3 |
| 9 | 11.8 | 12.3 | 11.1 | 12.8 | 0.7 | 12.0 | 0.8 | 11.8 | 0.4 |
| 10 | 9.9 | 10.6 | 12.1 | 11.1 | 0.9 | 10.9 | 0.9 | 11.0 | 0.1 |
| 11 | 10.8 | 12.5 | 10.7 | 11.8 | 0.9 | 11.5 | 1.1 | 11.5 | 0.3 |
| Comparative Example | | | | | | | | | |
| 1 | 22.1 | 28.6 | 45.8 | 32.1 | 10.0 | 32.2 | 9.6 | 34.4 | 2.6 |
| 2 | 48.1 | 25.1 | 30.1 | 25.1 | 10.9 | 32.1 | 7.7 | 30.4 | 1.6 |
| 3 | 35.0 | 31.1 | 22.4 | 22.5 | 6.3 | 27.8 | 6.5 | 25.1 | 2.3 |
| 4 | 24.1 | 26.5 | 12.1 | 14.1 | 7.2 | 19.2 | 6.1 | 20.3 | 1.0 |

(Area Proportion of Crystal Grains with Straight-Line Grain Boundary)

According to the method described above, the indium target obtained in each of the examples and the comparative examples was etched with hydrochloric acid and then photographed with a digital camera. Using image processing software (analySIS FIVE manufactured by Olympus Corporation), the image was analyzed to determine the area proportion of crystal grains with a straight-line grain boundary. The results are shown in Table 3.

(Coincidence Boundary)

The target obtained in each of the examples and the comparative examples was analyzed for crystal orientation by EBSP method using an FE-EPMA (JXA-8500F manufactured by JEOL Ltd.), and it was determined whether or not crystal grain boundaries included a Σ7 coincidence boundary according to the method described above. The software used for the analysis was TSL OIM Analysis manufactured by TexSEM Laboratories, Inc. The results are shown in Table 3.

TABLE 3

| | Working method | Average amount of thickness reduction [mm] | Total thickness reduction rate [%] | Area proportion of crystal grains with straight-line grain boundary [%] | Presence or absence of Σ7 coincidence boundary |
|---|---|---|---|---|---|
| Example | | | | | |
| 1 | Cold pressing | 1.5 | 10.6 | 5 | Present |
| 2 | Cold pressing | 2.0 | 14.3 | 15 | Present |
| 3 | Cold pressing | 2.6 | 18.4 | 25 | Present |
| 4 | Cold pressing | 3.0 | 21.5 | 35 | Present |
| 5 | Cold pressing | 3.9 | 27.6 | 50 | Present |
| 6 | Cold pressing | 4.4 | 31.7 | 70 | Present |
| 7 | Cold pressing | 7.0 | 50.0 | 95 | Present |

TABLE 3-continued

| | Working method | Average amount of thickness reduction [mm] | Total thickness reduction rate [%] | Area proportion of crystal grains with straight-line grain boundary [%] | Presence or absence of Σ7 coincidence boundary |
|---|---|---|---|---|---|
| 8 | Warm pressing | 2.5 | 17.8 | 25 | Present |
| 9 | Warm rolling | 2.6 | 18.2 | 25 | Present |
| 10 | Cold rolling | 2.6 | 18.3 | 25 | Present |
| 11 | Extruding | 2.5 | 17.8 | 25 | Present |
| Comparative Example | | | | | |
| 1 | Cold pressing | 0.0 | 0.0 | 0 | Absent |
| 2 | Cold pressing | 0.3 | 2.2 | 2 | Present |
| 3 | Cold pressing | 0.5 | 3.7 | 3 | Present |
| 4 | Cold pressing | 1.1 | 7.7 | 4 | Present |

(Sputtering Characteristics)

The indium target obtained in each of the examples and the comparative examples was sputtered, and sputtered films were formed on substrates placed at sites (three in total) corresponding to the central portion and both end portions in the longitudinal direction. The thickness of each sputtered film was determined. Specifically, the sputtering was performed under the conditions shown below, and the thickness of the resulting film was calculated from the weights of the substrate before and after the sputtering. The deposition rate was also calculated from the average of the film thicknesses at the three sites. The results are shown in Table 4. The sputtering conditions are as follows.

Sputtering gas: Ar

Sputtering gas pressure: 0.5 Pa

Sputtering gas flow rate: 50 SCCM

Sputtering temperature: R.T. (non-heating)

Applied sputtering power density: 1.3 W/cm$^2$ (the power density is power applied per 1 cm$^2$ of the target surface.)

Substrate: Eagle 2000 manufactured by Corning Incorporated, 4 inches φ×0.7 mm t

Pre-sputtering: 1 hour under the above conditions

TABLE 4

| | Working method | Average amount of thickness reduction [mm] | Total thickness reduction rate [%] | Film thickness at center [Å] | Film thickness at end portion A [Å] | Film thickness at end portion B [Å] | Standard deviation | Deposition rate [Å/min] |
|---|---|---|---|---|---|---|---|---|
| Example | | | | | | | | |
| 1 | Cold pressing | 1.5 | 10.6 | 2345 | 2340 | 2290 | 30.4 | 2325 |
| 2 | Cold pressing | 2.0 | 14.3 | 2397 | 2411 | 2355 | 29.1 | 2388 |
| 3 | Cold pressing | 2.6 | 18.4 | 2471 | 2460 | 2421 | 26.3 | 2451 |
| 4 | Cold pressing | 3.0 | 21.5 | 2511 | 2503 | 2469 | 22.3 | 2494 |
| 5 | Cold pressing | 3.9 | 27.6 | 2550 | 2532 | 2512 | 19.0 | 2531 |
| 6 | Cold pressing | 4.4 | 31.7 | 2514 | 2533 | 2545 | 15.6 | 2531 |
| 7 | Cold pressing | 7.0 | 50.0 | 2578 | 2591 | 2561 | 15.0 | 2577 |
| 8 | Warm pressing | 2.5 | 17.8 | 2478 | 2451 | 2431 | 23.6 | 2453 |
| 9 | Warm rolling | 2.6 | 18.2 | 2511 | 2519 | 2475 | 23.4 | 2502 |
| 10 | Cold rolling | 2.6 | 18.3 | 2498 | 2452 | 2488 | 24.2 | 2479 |
| 11 | Extruding | 2.5 | 17.8 | 2491 | 2485 | 2449 | 22.7 | 2478 |
| Comparative Example | | | | | | | | |
| 1 | Cold pressing | 0.0 | 0.0 | 2211 | 1911 | 1901 | 176.2 | 2008 |
| 2 | Cold pressing | 0.3 | 2.2 | 2110 | 1952 | 2213 | 131.5 | 2092 |
| 3 | Cold pressing | 0.5 | 3.7 | 2112 | 2017 | 2255 | 119.8 | 2128 |
| 4 | Cold pressing | 1.1 | 7.7 | 2240 | 2055 | 2255 | 111.4 | 2183 |

DISCUSSION

The results show that films with high in-plane uniformity can be formed by sputtering using the sputtering target of the invention. The results also show that the use of the sputtering target having straight-line grain boundaries increases the deposition rate.

In Comparative Example 1 where the pressing is not performed, the crystal grains are coarse, the standard deviation is large, and the grain size apparently varies in the longitudinal direction of the target. In Comparative Example 1, the film thickness distribution is also nonuniform.

In Comparative Examples 2 to 4 where the pressing is performed but the total thickness reduction rate is low, the crystal grains are still coarse, the standard deviation is still large, and the grain size varies in the longitudinal direction of the target. In Comparative Examples 2 to 4, the film thickness distribution is also nonuniform.

REFERENCE SIGNS LIST

100 Semi-finished product of cylindrical target
101 Mount
102 Support
103 Indium
104 Backing tube
105 Shaft

The invention claimed is:

1. An indium cylindrical target comprising crystal grains whose average size is 1 mm to 20 mm over its surface to be sputtered, wherein the indium cylindrical target comprises crystal grains with a straight-line grain boundary on its surface to be sputtered, wherein the straight-line grain boundary has a protrusion of grain boundary from a line segment defined by a straight line drawn between adjacent corners of a crystal grain and has an at least 50 μm long straight-line region, the protrusion being less than 0.1 mm in a direction of a normal to the line segment.

2. The indium cylindrical target according to claim 1, wherein the standard deviation of average crystal grain sizes measured at positions separated by 90° along its circumference is 6 mm or less at each of its central portion, its one end portion and its another end portion in a longitudinal direction.

3. The indium cylindrical target according to claim 1, wherein at least part of the straight-line grain boundary is a coincidence boundary.

4. The indium cylindrical target according to claim 3, wherein the coincidence boundary has a $\Sigma$ value of 7.

5. The indium cylindrical target according to claim 1, wherein an area proportion of the crystal grains with a straight-line grain boundary is at least 5%.

6. The indium cylindrical target according to claim 1, wherein the standard deviation of average crystal grain size is 6 mm or less over its surface to be sputtered.

7. The indium cylindrical target according to claim 1, wherein the standard deviation of average crystal grain sizes at three places including a central portion, one end portion and another end portion in a longitudinal direction is 0.9 mm or less.

8. A method for manufacturing the indium cylindrical target according to claim 1, comprising the steps of: casting a semi-finished product of an indium cylindrical target integrated with a backing tube; and subjecting the semi-finished product to plastic working in its radial direction, wherein the plastic working is performed with a total thickness reduction rate of at least 10% over a longitudinal direction of the semi-finished product.

9. The method according to claim 8, wherein the total thickness reduction rate is 50% or less.

10. The method according to claim 8, wherein the plastic working is performed in such a manner that the standard deviation of thickness reduction rates along a circumference direction of the semi-finished product of the indium cylindrical target is 5 or less.

11. The method according to claim 8, wherein the plastic working is performed using at least one method selected from the group consisting of rolling, extruding and pressing.

12. The method according to claim 8, wherein the plastic working is performed while a shaft is inserted in the backing tube.

* * * * *

UNITED STATES PATENT AND TRADEMARK OFFICE
CERTIFICATE OF CORRECTION

PATENT NO. : 9,761,421 B2  Page 1 of 1
APPLICATION NO. : 14/375811
DATED : September 12, 2017
INVENTOR(S) : Endo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 105 days.

Signed and Sealed this
Twenty-fifth Day of September, 2018

Andrei Iancu
*Director of the United States Patent and Trademark Office*